US007205823B2

(12) United States Patent
Chen (10) Patent No.: US 7,205,823 B2
(45) Date of Patent: Apr. 17, 2007

(54) OSCILLATING BUFFER WITH SINGLE GATE OXIDE DEVICES (75) Inventor: Kuo-Ji Chen, Taipei County (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 113 days.

(21) Appl. No.: 11/063,920

(22) Filed: Feb. 23, 2005

(65) Prior Publication Data
US 2006/0197616 A1 Sep. 7, 2006

(51) Int. Cl.
*H03K 3/01* (2006.01)
(52) U.S. Cl. .................................... 327/534; 327/108
(58) Field of Classification Search ................. 327/534, 327/108
See application file for complete search history.

(56) References Cited

U.S. PATENT DOCUMENTS

| 6,268,744 | B1 * | 7/2001 | Drapkin et al. ................. 326/81 |
| 6,304,110 | B1 * | 10/2001 | Hirano .......................... 327/108 |
| 6,342,996 | B1 * | 1/2002 | Drapkin et al. ............... 361/91.1 |
| 6,489,828 | B1 * | 12/2002 | Wang et al. ................... 327/333 |
| 6,614,283 | B1 * | 9/2003 | Wright et al. ................. 327/333 |
| 6,970,024 | B1 * | 11/2005 | Reese et al. .................. 327/112 |
| 7,002,379 | B2 * | 2/2006 | Ajit ............................... 327/108 |

* cited by examiner

*Primary Examiner*—Kenneth B. Wells
(74) *Attorney, Agent, or Firm*—Duane Morris LLP (57) ABSTRACT An oscillating buffer is coupled to an oscillating source, in parallel, for providing a predetermined waveform at a predetermined frequency for a core circuit with a plurality of MOS transistors operating at a core voltage. In one embodiment, the oscillating buffer includes an inverter, coupled between the core voltage and ground, for amplifying an input signal from the oscillating source. The inverter has one or more MOS transistors with gate oxides of a thickness substantially the same as that of the MOS transistors of the core circuit.

17 Claims, 6 Drawing Sheets

OSCILLATING BUFFER WITH SINGLE GATE OXIDE DEVICES

BACKGROUND

The present invention relates generally to integrated circuit designs, and more particularly to an oscillating buffer with single gate oxide devices.

Oscillators are often used in semiconductor technology for clock modules, logic gates, oscillating chips, and much more. A conventional oscillator contains a crystal attached with a pair of capacitors along with some initial resistance. The RC network of the capacitors and resistance can help to adjust the timing of the oscillator. An oscillating buffer is coupled, in parallel, to the crystal. A conventional oscillating buffer works like an inverter by producing an amplified, inversed output signal. The crystal, RC network and oscillating buffer provide a predetermined waveform at a predetermined frequency.

The conventional oscillating buffer uses thick-gate devices and a higher source voltage for a signal input of a higher voltage, such as an input/output (I/O) voltage for I/O circuitries of an integrated circuit. However, a thin-gate devices are used in the core circuit operating at a lower voltage. This results in an integrated circuit with thick-gate and thin-gate oxide devices. Since such dual-gate oxide devices require separate sets of masks for their own fabrication processes, the fabrication of the integrated circuit that includes the conventional oscillating buffer and core circuit is complicated and costly.

Desirable in the art of oscillating buffer designs is an oscillating buffer with single gate oxide devices that operate at a core voltage, thereby simplifying the fabrication process and the cost.

SUMMARY

In view of the foregoing, this invention provides an oscillating buffer coupled to an oscillating source, in parallel, for providing a predetermined waveform at a predetermined frequency for a core circuit with a plurality of MOS transistors operating at a core voltage. In one embodiment, the oscillating buffer includes an inverter, coupled between the core voltage and ground, for amplifying an input signal from the oscillating source. The inverter has one or more MOS transistors with gate oxides of a thickness substantially the same as that of the MOS transistors of the core circuit.

The construction and method of operation of the invention, however, together with additional objects and advantages thereof will be best understood from the following description of specific embodiments when read in connection with the accompanying drawings.

DESCRIPTION

Figure 1A:
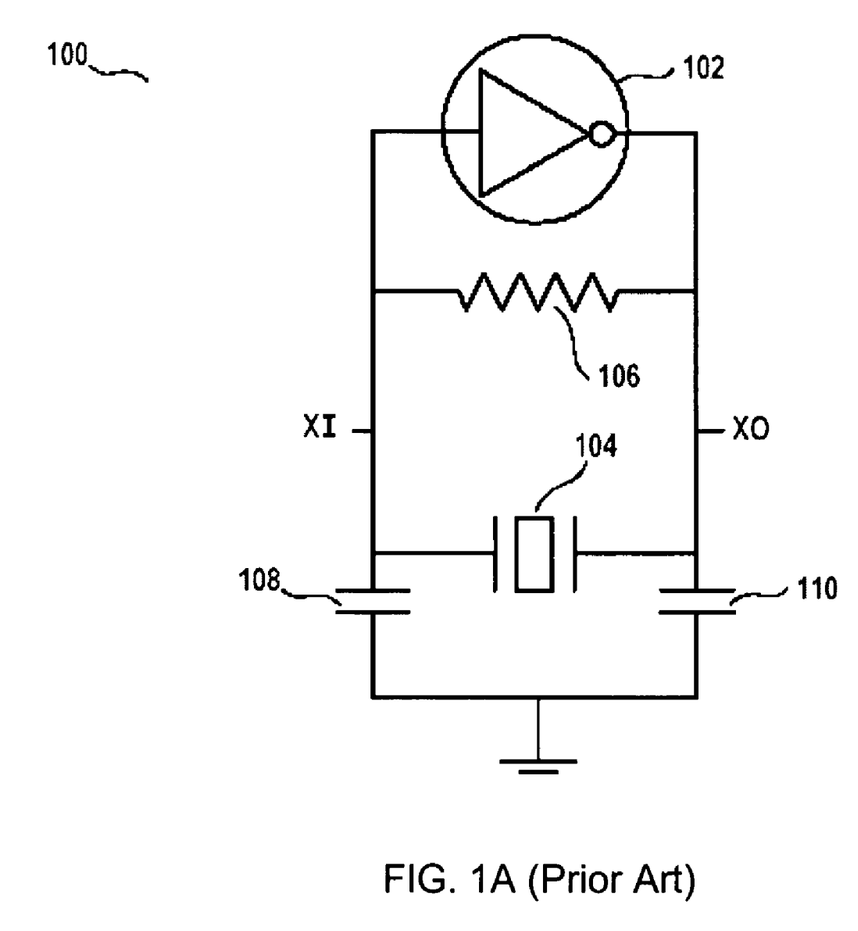
FIG. 1A illustrates a conventional crystal oscillator.

FIG. 1A illustrates a conventional crystal oscillator 100. An oscillating buffer 102, crystal 104, and resistor 106 are placed in parallel between an input node XI and an output node XO. Capacitors 108 and 110 are coupled to the crystal 104. The capacitors 108 and 110 along with the resistor 106 help to control the timing of the oscillating buffer 102 to provide an output waveform with high and low signals at a predetermined frequency, depending on the characteristics of the crystal 104, the resistance of the resistor 106 and the capacitances of the capacitors 108 and 110.

Figure 1B:
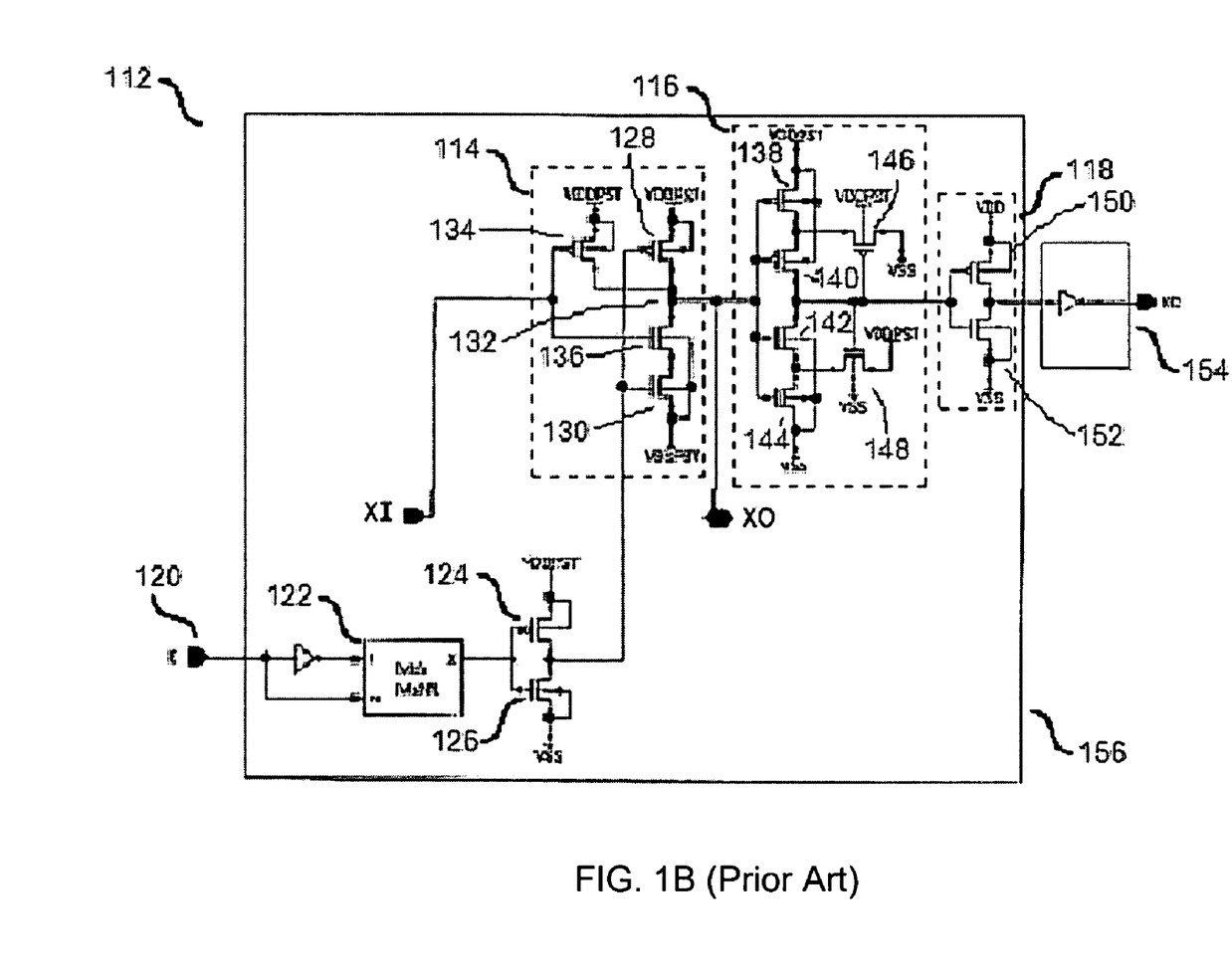
FIG. 1B illustrates a partial view of a conventional oscillator that uses dual-gate oxide devices.

FIG. 1B illustrates a partial schematic view of a conventional oscillator 112. The conventional oscillator 112 includes an oscillating buffer 114, which has essentially the same function as the oscillating buffer 102, as shown in FIG. 1A. The oscillator 112 further includes a Schmitt trigger 116 and a level shifter 118. The oscillating buffer 114 is implemented with an enable pin 120. A level shifter 122 takes in a signal ranging from 0 to VDD, such as the low core voltage, from the enable pin 120 and provides a signal for an inverter composed of a PMOS transistor 124 and an NMOS transistor 126. If the signal from the level shifter 122 entering the PMOS transistor 124 and the NMOS transistor 126 is high, the PMOS transistor 124 will turn off, and the NMOS transistor 126 will turn on, thereby providing a low signal for a PMOS transistor 128 and an NMOS transistor 130. When the NMOS transistor 130 is turned off and the PMOS transistor 128 is turned on, a high voltage VDDPST, such as the I/O voltage, reaches a node 132 and an output node XO. Since, with the PMOS transistor 128 turned on, the output node XO will have a high output, the oscillating buffer 114 is disabled. If the signal exiting the level shifter 122 is low, the PMOS transistor 124 will turn on, and the high voltage VDDPST will turn off the PMOS transistor 128 and turn on the NMOS transistor 130, thereby enabling the oscillating buffer 114. When the oscillating buffer 114 is enabled, an input signal from an input node XI determines the output at the output node XO. If an input signal at the input node XI is high, a PMOS transistor 134 will turn off and an NMOS transistor 136 will turn on, thereby grounding the node 132 and providing a low signal for the output node XO. If the input signal at the input node XI is low, the NMOS transistor 136 will turn off and the PMOS transistor 134 will turn on, thereby allowing the high voltage VDDPST to reach the node 132 and providing a high output signal at the output node XO.

The output signal at the node 132 will reach the Schmitt trigger 116 where PMOS transistors 138 and 140 are placed in a stacked configuration, along with two stacked NMOS transistors 142 and 144. The PMOS transistors 138 and 140 and the NMOS transistors 142 and 144 work together with a PMOS transistor 146 and an NMOS transistor 148 to provide a delay window to lessen the jitter caused from oscillation. The level shifter 118, which includes a PMOS transistor 150 and an NMOS transistor 152, simply lowers the voltage level from the high voltage VDDPST to a low voltage VDD, before the signal is sent out to an output buffer 154. It is noteworthy that the output buffer 154 will use only thin-gate devices that operate at the low voltage VDD, while all devices for the conventional oscillator 112, marked within a block 156, are thick-gate devices operating at the high voltage VDDPST.

As discussed in the background, those dual-gate devices complicate the fabrication processes of the conventional oscillator 112 and increase the fabrication cost of the same.

Figure 4:
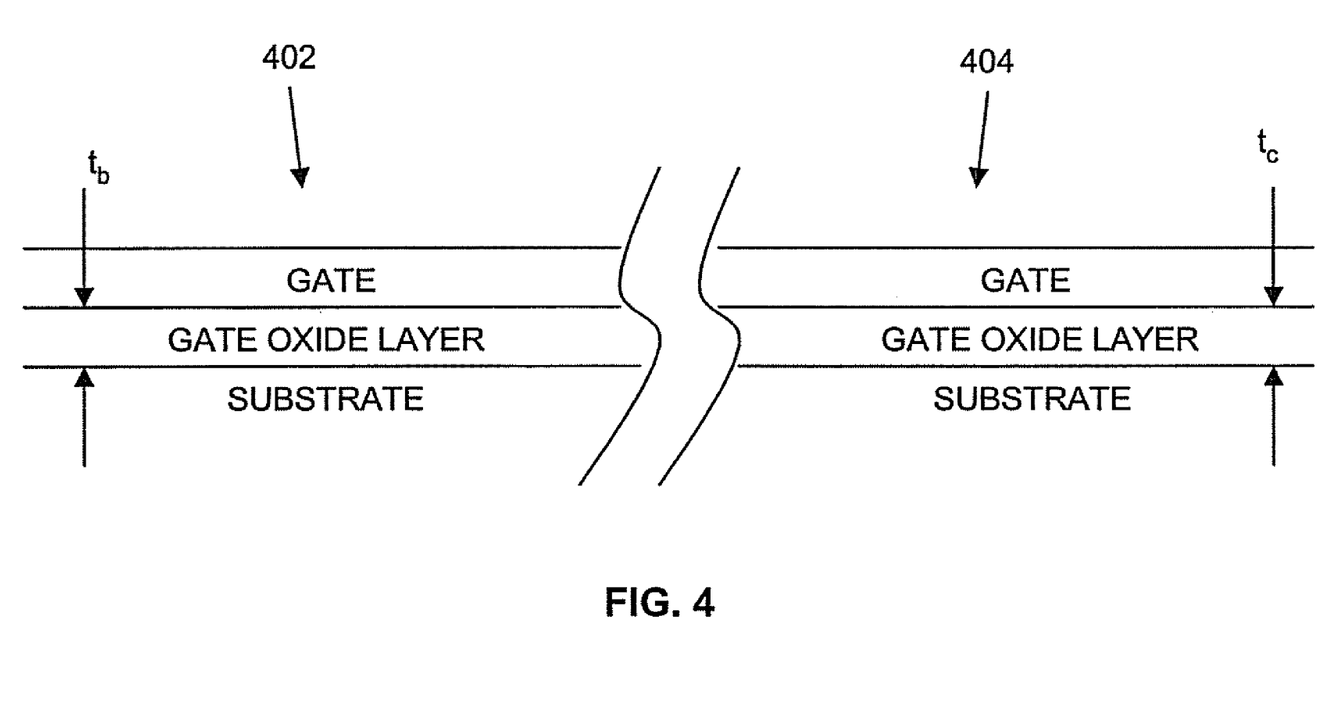
FIG. 4 illustrates a cross sectional view of a MOS transistor of an inverter and a MOS transistor of a core circuit in accordance with one embodiment of the present invention.

The present invention discloses an oscillating buffer coupled to an oscillating source, in parallel, for providing a predetermined waveform at a predetermined frequency for a core circuit with a plurality of MOS transistors operating at a low voltage, such as a core voltage. The oscillating buffer operates at the low voltage, and is composed of thin-gate devices of a thickness substantially the same as that of devices in the core circuit. For example, as illustrated in FIG. 4, oscillating buffer MOS transistor 402 has a gate oxide layer of thickness $t_b$, and core circuit MOS transistor 404 has a gate oxide later of thickness $t_c$, where $t_b$ is substantially equal to $t_c$. No separate mask is needed for fabricating the oscillating buffer and the core circuit. Thus, the fabrication processes of the oscillating buffer is simplified, and its costs are reduced.

Figure 2A:
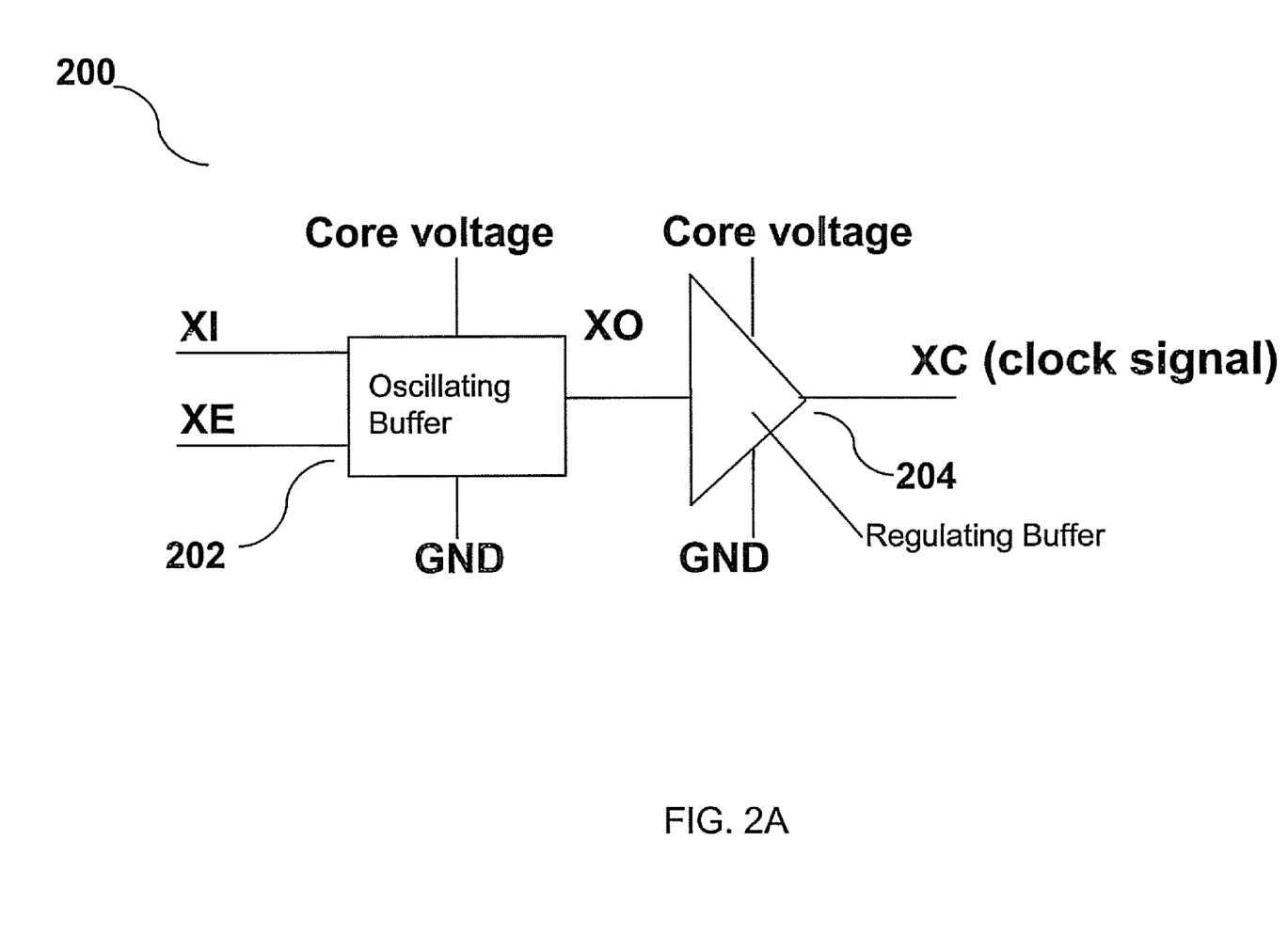
FIG. 2A illustrates an oscillating buffer with a regulating buffer in accordance with one embodiment of the present invention.
Figure 2B:
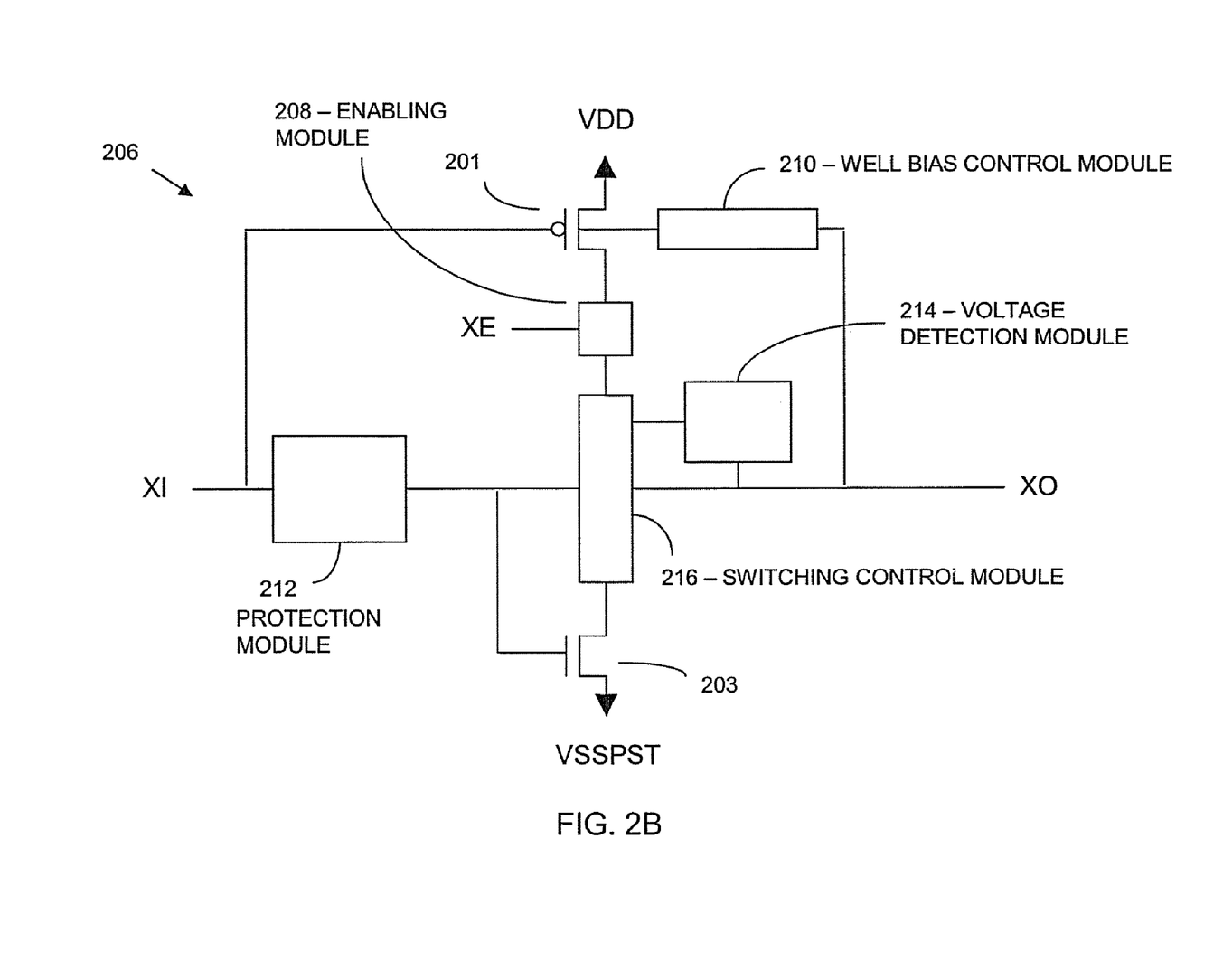
FIG. 2B illustrates a functional block diagram of an oscillating buffer in accordance with another embodiment of the present invention.

FIG. 2A illustrates a functional block diagram 200 showing an oscillating buffer 202 and a regulating buffer 204, in accordance with one embodiment of the present invention. FIG. 2B illustrates a sample oscillating buffer 206 for providing the function of the oscillating buffer 202 as shown in FIG. 2A.

Both the oscillating buffer 202 and the regulating buffer 204 are supplied by a relatively low voltage VDD, such as a core voltage. The regulating buffer 204 may be a Schmitt trigger that provides a delay window or some hysteresis for the output signal before outputting a clock signal to a final output node XC.

In the embodiment, the oscillating buffer 202 includes an inverter, coupled between the low voltage VDD and ground, for inverting and amplifying an input signal from the oscillating source, such as a crystal. The inverter has one or more MOS transistors with gate oxides of a thickness substantially the same as that of the MOS transistors of a core circuit (not shown in this figure) that receives the clock signal from the final output node XC. As a suggested design rule, the input signal at the input node XI may have a voltage level lower than the core voltage plus a maximum voltage drop across the gate oxide so that it does not degrade the reliability performance thereof.

In another embodiment, the oscillating buffer 202 is implemented with an optional enabling module controlled by an enable pin XE. An input node XI provides the input signal from a crystal (not shown) and an output node XO provides the output signal back to the crystal. The enabling module, in combination with the inverter, functions as a NAND gate adapted to receive an enabling signal for the enabling module, and the input signal for the inverter. The enabling module may include one or more MOS transistors having gate oxides of a thickness substantially the same as that of the MOS transistors of the core circuit.

Referring to FIG. 2B, the oscillating buffer 206 includes an inverter, having at least one PMOS transistor 201 coupled to a low voltage VDD, and at least one NMOS transistor 203 coupled to a voltage lower than VDD, such as GND or VSSPST. The PMOS and NMOS transistors 201 and 203 collectively operate as an inverter, and are switched by an input signal received at an input node XI for selectively outputting the VDD or VSSPST to an output node XO. A well bias control module 210 is coupled to a body of the PMOS transistor 201 for biasing the body thereof in response to a voltage level at the output node, thereby avoiding a leakage current from VDD to the output node XO through the PMOS transistor 201.

In this embodiment, the well bias control module 210 applies VDD to the body of the PMOS transistor 201 when the voltage level at the output node XO is lower than VDD. It applies a high voltage VDDPST, such as an I/O voltage higher than VDD, to the body when the voltage level at the output node XO is higher than VDD plus a threshold voltage Vtp of the PMOS transistor 201. This creates a zero volt voltage difference at the PN junction of the PMOS transistor 201, such that avoiding a current flow therethrough.

The oscillating buffer 206 further includes a switching control module 216 serially coupled between the PMOS transistor 201 and NMOS transistor 203. The switching control module 216 is adapted to pass or block VDD or GND to the output node XO through the PMOS transistor 201 or the NMOS transistor 203, respectively. A voltage detection module 214 is coupled to the switching control module 216 for controlling the same to pass or block VDD or GND. For example, the voltage detection module 214 causes the switching control module 216 to pass VDD to the output node XO through the PMOS transistor 201, when the voltage level at the output node is lower than VDD plus a threshold voltage Vtp of the PMOS transistor 201. In another example, the voltage detection module 214 causes the switching control module 216 to block VDD to the output node XO through the PMOS transistor 201, when the voltage level at the output node XO is higher than VDD plus the threshold voltage Vtp of the PMOS transistor 201. The well control bias module 210, voltage detection module 214 and the switching control module 216 ensure that no undesired leakage current would flow between VDD and the output node XO.

Generally, the oscillating buffer 206 operates at two modes: a normal operation mode in which an input signal input passes from the input node XI to the output node XO; a testing mode in which a testing clock signal may enter the oscillating buffer 206 from either the input node XI or output node XO. Since all of the devices in the oscillating buffer 206 are made of thin-gate devices, when the testing clock signal at the output node XO has a voltage level higher than VDD, protective designs are needed to avoid a leakage current between VDD and the output node XO. For example, when the testing clock signal at the output node XO has a voltage level of VDDPST that is higher than VDD plus the threshold voltage Vtp of the PMOS transistor 201, the well bias control module 210 applies a voltage equal to VDDPST to the body of the PMOS transistor 201 to avoid a leakage current flowing therethrough. Meanwhile, the voltage detection module 214 detects that the testing clock signal at the output node XO has a voltage level of VDDPST that is higher than VDD plus the threshold voltage Vtp, it causes the switching control module 216 to block the current path from the PMOS transistor 201 to the output node XO. This makes it possible to construct the proposed oscillating buffer 206 with single-gate devices without causing the leakage current.

The oscillating buffer 206 further includes an enabling module 208 serially coupled between the PMOS transistor 201 and NMOS transistor 203 for selectively enabling or disabling the inverter in response to an external enabling signal received at the enabling node XE. A protection module 212 is coupled between the input node XI and the gate of the NMOS transistor 203 for protecting a gate oxide of the NMOS transistor 203 from damage caused by high voltage signals.

Figure 3:
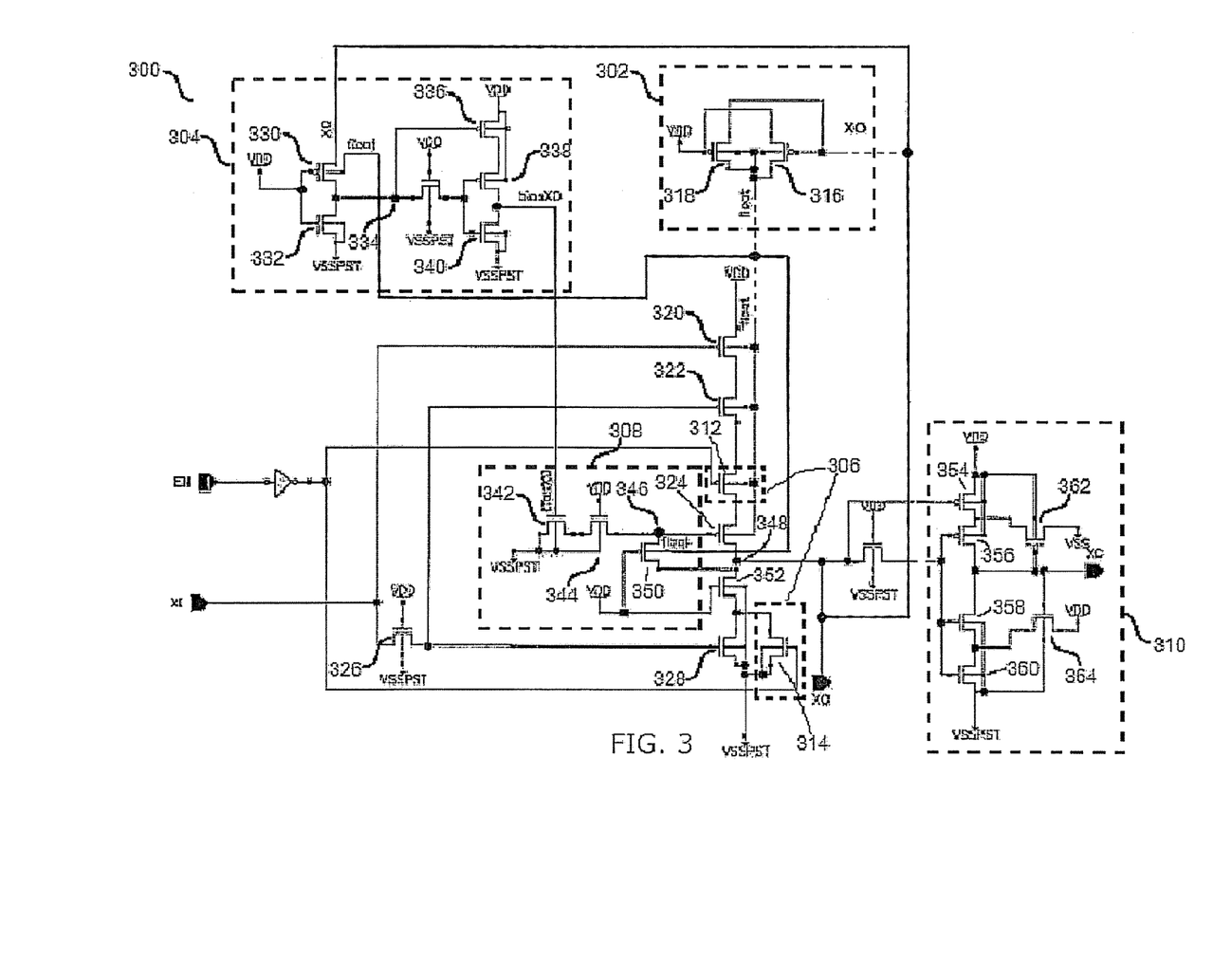
FIG. 3 illustrates a detailed circuit design of the oscillating buffer in accordance with the embodiment of the present invention.

FIG. 3 illustrates a detailed circuit design of an oscillating buffer 300 connected to a Schmitt trigger 310, in accordance with one embodiment of the present invention. The oscillating buffer 300 contains several modules mentioned in FIG. 2B: a well bias control module 302, a voltage detection module 304, an enabling module 306 and a switching control module 308.

The oscillating module 300 includes an inverter composed of two serially connected PMOS transistors 320 and 322, and an NMOS transistor 328. The PMOS transistors 320 and 322 are coupled to a low voltage VDD, such as a core voltage, and the NMOS transistor 328 is coupled to VSSPST, such as ground. The PMOS and NMOS transistors 320, 322 and 328 are switched by an input signal received at an input node XI for selectively passing VDD or VSSPST therethrough. An NMOS transistor 326 connects the input node XI to the gates of the PMOS transistor 322 and the NMOS transistor 328 for protecting the same from excessive voltage.

An enabling module 306 is implemented in the oscillating buffer 300 for enabling or disabling the same in response to an enabling signal received at an enabling node EN. The enabling module 306 includes a PMOS transistor 312 serially coupled to the PMOS transistor 322, and having its gate connected to the enabling node EN through an inverter. It further includes an NMOS 314 coupled, in parallel, to the NMOS transistor 328, and having its gate connected to the enabling node EN through the inverter.

The switching control module 308 controls a PMOS transistor 324 to pass or block VDD to a node 348 through PMOS transistors 320, 322, 312. In the switching control module 308, a PMOS transistor 350 is coupled to the gate of the PMOS transistor 324 through a node 346, and the drain of an NMOS transistor 352. The gate of the PMOS transistor 350 is connected to the gate of the NMOS transistor 352, and further connected to VDD. NMOS transistors 342 and 344 are serially connected between VSSPST and the node 346. The gate of the NMOS transistor 344 is biased by VDD, and the gate of the NMOS transistor 342 is connected to the voltage detection module 304 through a bias line "biasXO."

The voltage detection module 304 includes a PMOS transistor 330 and an NMOS transistor 332, serially connected between VSSPST and the output node XO, which is connected to the node 348. The gates of the PMOS transistor 330 and the NMOS transistor 332 are biased by VDD. The bodies of the PMOS transistors 330 and 350 are tied together. The drains of the PMOS transistor 330 and the NMOS transistor 332 are connected to a node 334, which is further coupled to the gate of a PMOS transistor 336, and the gates of a PMOS transistor 338 and an NMOS transistor 340, through an NMOS transistor. The transistors 336, 338 and 340 are serially coupled between VDD and VSSPST. The drains of the PMOS transistor 338 and the NMOS transistor 340 are connected to the gate of the NMOS transistor 342 through the bias line "biasXO."

The bodies of the PMOS transistors 320, 322, 312 and 324 are connected to the well bias control module 302 through a line "float," which may be controlled by a well bias control module 302. The well bias control module 302 includes two PMOS transistors 318 and 316. The gate of the PMOS transistor 318 is connected to VDD and further to a source of the PMOS transistor 316. The gate of the PMOS transistor 316 is connected to a source of the PMOS transistor 318, and further to the output node XO. The drains of PMOS transistors 316 and 318 are tied together, and further connected to the line "float." The well bias circuit biases the bodies of PMOS 312, 320, 322, 324 and 350 to the appropriate potential. (When the potential in XO is higher than VDD+Vthp, PMOS 318 turns on and the potential of node "float" equals to XO; when XO is lower than VDD, PMOS 316 turns on and the output in node "float" equals to VDD.)

The signals at the output node XO will pass to a final output node XC, which may be connected to a core circuit, through the Schmitt trigger 310. It includes a set of serially connected PMOS transistors 354, 356, and NMOS transistors 358, 360. A PMOS transistor 362, having its gate connected to the final output node XC, is connected to the drains of the PMOS transistors 354 and 356. An NMOS transistor 364, having its gate connected to the final output node XC, is connected to the drains of the NMOS transistors 358 and 360. The oscillating buffer 300 is supplied by a low voltage source VDD, while signals at the input node XI and output node XO may range from 0 volts to a high voltage VDDPST, such as an I/O voltage.

In this embodiment, the operation of the oscillating buffer 300 will be discussed in two modes: a normal operation mode and a testing mode. In the normal operation mode, the oscillating buffer 300 receives input signals varying from 0 volt to VDD, at the input node XI. Accordingly, output signals at the output node XO varies from 0 volt to VDD. In the testing mode, the oscillating buffer 300 receives an testing clock input varying from 0 volt to VDDPST, at either the input node XI or the output node XO. As discussed above, various designs, such as the well bias control module 302 and the voltage detection module 304 coupled with the switching control module 308 help the oscillating buffer 300 to tolerate the high voltage input, e.g., VDDPST, even though the devices therein are thin-gate devices.

In the normal operation mode, when the enable node EN receives a high signal, the PMOS transistor 312 is turned on, and the NMOS transistor 314 is turned off. Since the gate of the NMOS transistor 352 is connected to VDD, it is always on. In this mode, the voltage level at the output node always fall between 0 volt and VDD. The PMOS transistor 316 of the well bias control module 302 will turn on and the PMOS transistor 318 will turn off. This allows VDD to reach the floating line "float" that biases the bodies of PMOS transistors 320, 322, 312, and 324. In the voltage detection module 304, the PMOS transistor 330 and the NMOS transistor 332 make up an inverter. The PMOS transistor 330, which is biased by the floating line through the body, will be turned off, since the core voltage VDD at the gate of the PMOS transistor 330 has, at least, the same voltage as the source of the PMOS transistor 330 that is tied to the output node XO. The NMOS transistor 332 within the same inverter turns on, thereby drawing a node 334 to ground. The low signal at the node 334 turns on the PMOS transistors 336 and 338, and the NMOS transistor 340 will be turned off. This allows the core voltage VDD to reach a bias line "biasXO" and turn on the NMOS transistor 342 within the switching control module 308. Since the NMOS transistor 344 is designed to be on at all times, a node 346 will be drawn low to a ground signal VSSPST, thereby turning on the PMOS transistor 324.

When a low input signal is received at the input node XI, the PMOS transistors 320 and 322 are switched on, and an NMOS transistor 328 is switched off. So long as the voltage level at the output node XO is lower than VDD plus the threshold voltage of the thin-gate PMOS transistor used in the oscillating buffer 300, the voltage detection module 304 outputs a signal of VDD voltage. Since the voltage levels at the output node XO range from 0 volt to VDD, the voltage detection module 304 outputs a signal of VDD at the bias line "biasXO." This turns on the NMOS transistor 342, such that the gate of PMOS transistor 324 is biased at VSSPST, and it is, therefore, turned on. Given the PMOS transistors 320, 322, 312 and 324 are on, and the NMOS transistors 328 and 314 are off, a high signal (VDD) is output to the output node XO.

When a high input signal is received at the input node XI, the PMOS transistors 320 and 322 are switched off, and the NMOS transistor 328 is switched on. Since the voltage levels at the output node XO range from 0 volt to VDD, the voltage detection module 304 outputs a signal of VDD at the bias line "biasXO." This turns on the NMOS transistor 342, such that the gate of PMOS transistor 324 is biased at VSSPST, and it is, therefore, turned on. Given the PMOS transistors 320, and 322 are off, and the NMOS transistor 328 are on, a low signal is output to the output node XO.

In the testing mode the output node XO receives a testing clock input ranging from 0 volt to VDDPST. In order for the testing mode to operate properly, any leakage current through the PMOS transistors 320, 322, 312 and 324 should be avoided. The following describes how the proposed oscillating buffer 300 avoids such leakage current.

When the voltage at the output signal XO reaches VDDPST higher than VDD plus Vtp, the threshold voltage of the PMOS transistor, the PMOS transistor 316 within the well bias control module 302 will turn off, and the PMOS transistors 318 will turn on. This allows a higher voltage of the output signal at the node XO to reach the line "float" that biases the bodies of the PMOS transistors 320, 322, 312, and 324. In the voltage detection module 304, the PMOS transistor 330 and the NMOS transistor 332 are placed in an inverter configuration. The PMOS transistor 330 will turn on, since the low core voltage VDD at the gate of the PMOS transistor 330 is lower than the voltage at the source of the PMOS transistor 330 that is connected to the output line XO. This allows the high voltage of the output signal XO to reach the node 334, thereby turning off the PMOS transistors 336 and 338 and turning on the NMOS transistor 340. This pulls the bias line "biasXO" to low and turns off the NMOS transistor 342 within the switching control module 308. The PMOS transistor 350 will turn on because of the high voltage VDDPST at the node 348 from the output signal XO. With the PMOS transistor 350 turned on, the high source voltage VDDPST will turn off the PMOS transistor 324. As such, a leakage current through the PMOS transistors 320, 322, 312 and 324 can be avoided.

The output signal XO at the node 348 for both modes of operation will also be passed through a regulating buffer, such as a Schmitt trigger 310. The PMOS transistors 354 and 356 and the NMOS transistors 358 and 360 work together with a PMOS transistor 362 and a NMOS transistor 364, which are implemented to function as capacitors to provide some hysteresis in order to provide a delay window for the input signal to lessen the jitter caused from oscillation. The delayed signal will output through an output pin XC.

This invention provides various embodiments of an oscillating buffer, using only thin-gate, low voltage devices. As such, the oscillating buffer only requires relatively lower core voltage as its supply. Since both the input and output of the circuit are both supplied by the same lower core voltage, the need for any voltage level shifter is eliminated. The cost of fabrication process will also be lowered since dual-gate oxide devices are no longer necessary. In addition, the use of low voltage devices also helps to reduce the power and startup time of the oscillating buffer.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. An oscillating buffer coupled to an oscillating source and configured to output a predetermined waveform at a predetermined frequency to a core circuit with a plurality of metal-oxide-semiconductor (MOS) transistors operating at a core voltage, the oscillating buffer comprising:
    an inverter, coupled between the core voltage and ground, configured to receive an input signal from the oscillating source, the input signal having a voltage level lower than the core voltage plus a predetermined maximum voltage drop across the gate oxide.
    wherein the inverter has one or more MOS transistors with gate oxides of a thickness substantially the same as that of the MOS transistors of the core circuit; and
    an enabling module coupled to, and configured to function with, the inverter as a NAND gate and adapted to receive an enabling signal for the enabling module and the input signal for the inverter.

2. The oscillating buffer of claim 1 wherein the enabling module comprises one or more MOS transistors having gate oxides of a thickness substantially the same as that of the MOS transistors of the core circuit.

3. An oscillating buffer for providing a predetermined waveform at a predetermined frequency, comprising:
    an inverter, having at least one p-type metal-oxide-semiconductor (PMOS) transistor coupled to a first voltage, and at least one n-type metal-oxide-semiconductor (NMOS) transistor coupled to a second voltage lower than the first voltage, the PMOS and NMOS transistors being switched by an input signal received at an input node for selectively outputting the first voltage or the second voltage to an output node; and
    a well bias control module coupled to a body of the PMOS transistor for biasing the body thereof in response to a voltage level at the output node, thereby avoiding a leakage current between the first voltage and the output node through the PMOS transistor, wherein the bias control module applies the first voltage to the body of the PMOS transistor when the voltage level at the output node is lower than the first voltage and applies a third voltage, higher than the first voltage, to the body of the PMOS transistor when the voltage level at the output node is higher than the first voltage plus a threshold voltage of the PMOS transistor.

4. The oscillating buffer of claim 3 further comprising a switching control module serially coupled between the PMOS and NMOS transistors adapted to pass or block the first or second voltage to the output node through the PMOS transistor or the NMOS transistor, respectively.

5. The oscillating buffer of claim 4 further comprising a voltage detection module coupled to the switching control module for controlling the same to pass or block the first or second voltage to the output node, in response to the voltage level at the output node.

6. The oscillating buffer of claim 5 wherein the voltage detection module causes the switching control module to pass the first voltage to the output node through the PMOS transistor, when the voltage level at the output node is lower than the first voltage plus a threshold voltage of the PMOS transistor.

7. The oscillating buffer of claim 5 wherein the voltage detection module causes the switching control module to block the first voltage to the output node through the PMOS transistor, when the voltage level at the output node is higher than the first voltage plus a threshold voltage of the PMOS transistor.

8. The oscillating buffer of claim 3 further comprising an enabling module serially coupled between the PMOS and NMOS transistors for selectively enabling or disabling the inverter in response to an external enabling signal.

9. The oscillating buffer of claim 3 further comprising a protection module coupled between the input node and a gate of the NMOS transistor for protecting a gate oxide of the NMOS transistor from damage.

10. An oscillating buffer for providing a predetermined waveform at a predetermined frequency, comprising:
　an inverter, having at least one first p-type metal-oxide-semiconductor (PMOS) transistors coupled to a first voltage, and at least one first n-type metal-oxide-semiconductor (NMOS) transistor coupled to a second voltage lower than the first voltage, the first PMOS and NMOS transistors being switched by an input signal received at an input node for selectively outputting the first voltage or the second voltage to an output node;
　a well bias control module coupled to a body of the first PMOS transistor for biasing the body thereof in response to a voltage level at the output node, the well bias control module comprising:
　　a second PMOS transistor having a drain connected to the body of the first PMOS transistor and a gate connected to the first voltage, and
　　a third PMOS transistor having a drain connected to the body of the first PMOS transistor, a source connected to the first voltage and the gate of the second PMOS transistor, and a gate connected to a source of the second PMOS transistor and the output node; and
　a switching control module serially coupled between the first PMOS and NMOS transistors adapted to pass or block the first or second voltage to the output node through the PMOS transistor or the NMOS transistor, in response to the voltage level at the output node.

11. The oscillating buffer of claim 10 wherein the well bias control module applies the first voltage to the body of the first PMOS transistor when the voltage level at the output node is lower than the first voltage, and a third voltage higher than the first voltage to the body of the same when the voltage level at the output node is higher than the first voltage plus a threshold voltage of the first PMOS transistor.

12. The oscillating buffer of claim 10 further comprising a voltage detection module coupled to the switching control module for controlling the same to pass or block the first or second voltage to the output node, in response to the voltage level at the output node.

13. The oscillating buffer of claim 12 wherein the voltage detection module causes the switching control module to pass the first voltage to the output node through the PMOS transistor, when the voltage level at the output node is lower than the first voltage plus a threshold voltage of the PMOS transistor, and the voltage detection module causes the switching control module to block the first voltage to the output node through the PMOS transistor, when the voltage level at the output node is higher than the first voltage plus a threshold voltage of the PMOS transistor.

14. The oscillating buffer of claim 12 wherein the switching control module comprises:
　a fourth PMOS transistor serially coupled between the first PMOS transistor and the output node;
　a fifth PMOS transistor coupled between a gate of the fourth transistor and the output node, having its gate connected to the first voltage; and
　a second NMOS transistor serially coupled between the second voltage and the gate of the fourth transistor, having its gate connected to a bias output from the voltage detection module.

15. The oscillating buffer of claim 14 wherein the voltage detection module comprises:
　a sixth PMOS transistor having a source connected to the output node, and a gate connected to the first voltage; and
　a third NMOS transistor having a source connected to the second voltage, a drain connected to a drain of the sixth PMOS transistor, and a gate connected to the first voltage.

16. The oscillating buffer of claim 15 wherein the voltage detection module further comprises:
　a seventh PMOS transistor having a source connected to the first voltage and a gate connected to the drains of the sixth PMOS transistor and the third NMOS transistor; and
　a fourth NMOS transistor having a source connected to the second voltage, a gate connected to the drains of the sixth PMOS transistor and the third NMOS transistor, and a drain coupled to a drain of the seventh PMOS transistor,
　wherein the seventh PMOS transistor or the fourth NMOS transistor outputs the bias to the gate of the second NMOS transistor in response to the voltage at the output node of the inverter.

17. The oscillating buffer of claim 10 further comprising an enabling module serially coupled between the first PMOS and NMOS transistors for selectively enabling or disabling the inverter in response to an external enabling signal.

* * * * *

UNITED STATES PATENT AND TRADEMARK OFFICE
CERTIFICATE OF CORRECTION

PATENT NO. : 7,205,823 B2 Page 1 of 1
APPLICATION NO. : 11/063920
DATED : April 17, 2007
INVENTOR(S) : Kuo-Ji Chen

It is certified that error appears in the above-identified patent and that said Letters Patent is hereby corrected as shown below:

Column 3, line 62, delete "outpuffing" and insert therefore -- outputting --.

Column 8, line 42, delete "outpuffing" and insert therefore -- outputting --.

Signed and Sealed this

Ninth Day of October, 2007

JON W. DUDAS
*Director of the United States Patent and Trademark Office*